(12) United States Patent
Kim

(10) Patent No.: US 11,387,020 B2
(45) Date of Patent: Jul. 12, 2022

(54) SHUNT RESISTOR MODULE HAVING SCREW COUPLING STRUCTURE

(71) Applicant: LG Chem, Ltd., Seoul (KR)

(72) Inventor: Jeong Wan Kim, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/267,141

(22) PCT Filed: Dec. 10, 2019

(86) PCT No.: PCT/KR2019/017393
§ 371 (c)(1),
(2) Date: Feb. 9, 2021

(87) PCT Pub. No.: WO2020/130463
PCT Pub. Date: Jun. 25, 2020

(65) Prior Publication Data
US 2021/0375510 A1 Dec. 2, 2021

(30) Foreign Application Priority Data
Dec. 18, 2018 (KR) .................. 10-2018-0164125

(51) Int. Cl.
*H01C 1/14* (2006.01)
*G01R 15/14* (2006.01)
(Continued)

(52) U.S. Cl.
CPC .............. *H01C 1/14* (2013.01); *G01R 15/146* (2013.01); *G01R 19/0092* (2013.01); *H01C 1/01* (2013.01)

(58) Field of Classification Search
CPC .......... H01C 1/14; H01C 1/01; G01R 15/146; G01R 19/0092
See application file for complete search history.

(56) References Cited

U.S. PATENT DOCUMENTS 7,319,304 B2 * 1/2008 Veloo ..................... H05K 3/308
320/134
8,598,976 B2 * 12/2013 Hetzler .................. G01R 1/203
338/49
(Continued)

FOREIGN PATENT DOCUMENTS

JP H07333251 A 12/1995
JP 2002110268 A 4/2002
(Continued)

OTHER PUBLICATIONS

International Search Report for Application No. PCT/KR2019/017393, dated Apr. 7, 2020, 2 pages.

*Primary Examiner* — Kyung S Lee
(74) *Attorney, Agent, or Firm* — Lerner, David, Littenberg, Krumholz & Mentlik, LLP

(57) ABSTRACT

A shunt resistor module which is coupled to a printed circuit board to be used for current measurement, includes: a resistor portion configured to have predetermined resistance; at least two terminal portions configured to extend from opposite ends of the resistor portion; lead pins fixed to first sides of the terminal portions to protrude to be electrically connected to the printed circuit board; and an exterior member formed to at least partially cover first surfaces of the terminal portions and to have pin holes opened to expose the lead pins and screw holes formed to be screwed to the printed circuit board.

12 Claims, 3 Drawing Sheets

(51) Int. Cl.
    *G01R 19/00*      (2006.01)
    *H01C 1/01*      (2006.01)

(56) References Cited

U.S. PATENT DOCUMENTS

| | | | |
|---|---|---|---|
| 9,746,499 B2 * | 8/2017 | Chae | G01R 15/202 |
| 9,876,290 B2 | 1/2018 | Frank | |
| 10,021,788 B2 | 7/2018 | Ullermann et al. | |
| 10,157,698 B2 * | 12/2018 | Nakamura | H01C 13/00 |
| 10,161,968 B2 | 12/2018 | Nakamura et al. | |
| 10,163,553 B2 * | 12/2018 | Kameko | H01C 17/28 |
| 10,192,440 B2 | 1/2019 | Hohenacker | |
| 10,726,724 B2 | 7/2020 | Hohenacker | |
| 10,774,932 B2 | 9/2020 | Hocker et al. | |
| 10,969,408 B2 * | 4/2021 | Miyajima | G01R 15/146 |
| 11,061,054 B2 * | 7/2021 | Endo | G01R 1/20 |
| 11,164,687 B2 * | 11/2021 | Endo | H01C 1/01 |
| 2005/0057865 A1 * | 3/2005 | Veloo | B60R 16/023 |
| | | | 361/56 |
| 2011/0298454 A1 * | 12/2011 | Ausserlechner | G01R 19/00 |
| | | | 324/252 |
| 2014/0015636 A1 | 1/2014 | Tanaka et al. | |
| 2015/0309080 A1 * | 10/2015 | Chae | G01R 15/202 |
| | | | 324/251 |
| 2016/0177932 A1 | 6/2016 | Rogg | |
| 2017/0101606 A1 | 4/2017 | Klug et al. | |
| 2017/0261105 A1 | 9/2017 | Hocker et al. | |
| 2017/0261106 A1 | 9/2017 | Hocker et al. | |
| 2017/0261536 A1 * | 9/2017 | Chae | G01R 15/142 |
| 2018/0113153 A1 | 4/2018 | Jang et al. | |
| 2018/0322710 A1 | 11/2018 | Hohenacker | |
| 2021/0382092 A1 * | 12/2021 | Thumm | G01R 1/203 |

FOREIGN PATENT DOCUMENTS

| | | |
|---|---|---|
| JP | 2012215452 A | 11/2012 |
| JP | 2015145813 A | 8/2015 |
| JP | 2018025446 A | 2/2018 |
| JP | 2018110264 A | 7/2018 |
| KR | 101407664 B1 | 6/2014 |
| KR | 20160147905 A | 12/2016 |
| KR | 20170104828 A | 9/2017 |
| KR | 20180044725 A | 5/2018 |

* cited by examiner

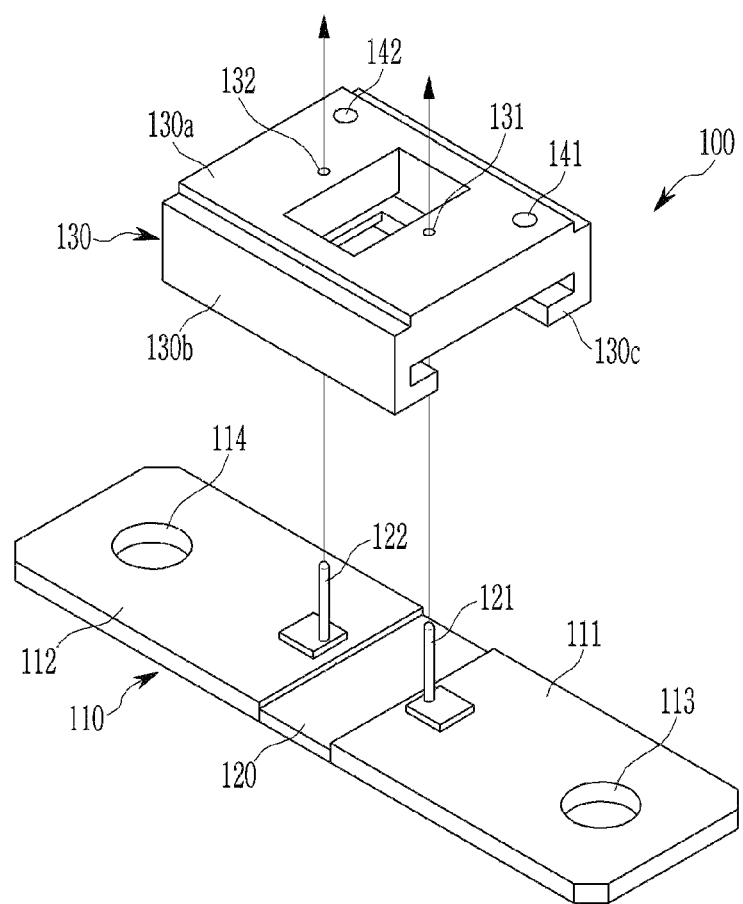
[Figure 1]

[Figure 2]
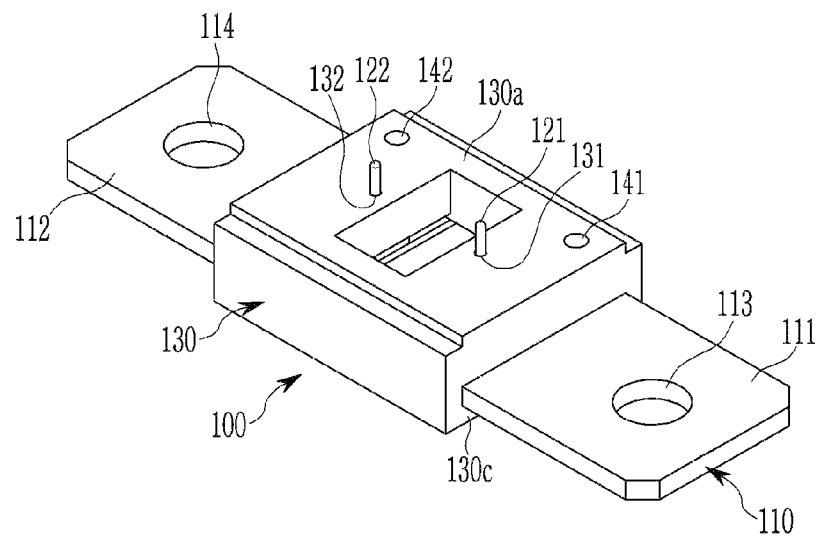
[Figure 3]
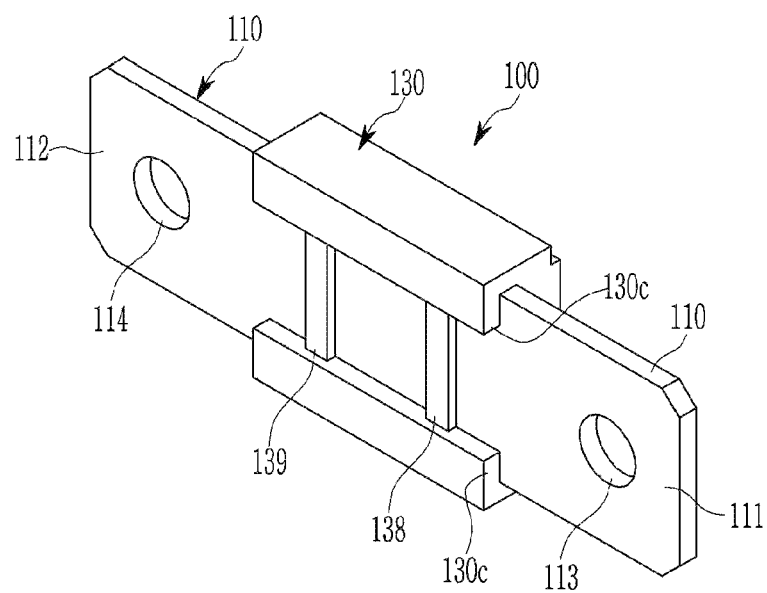

【Figure 4】
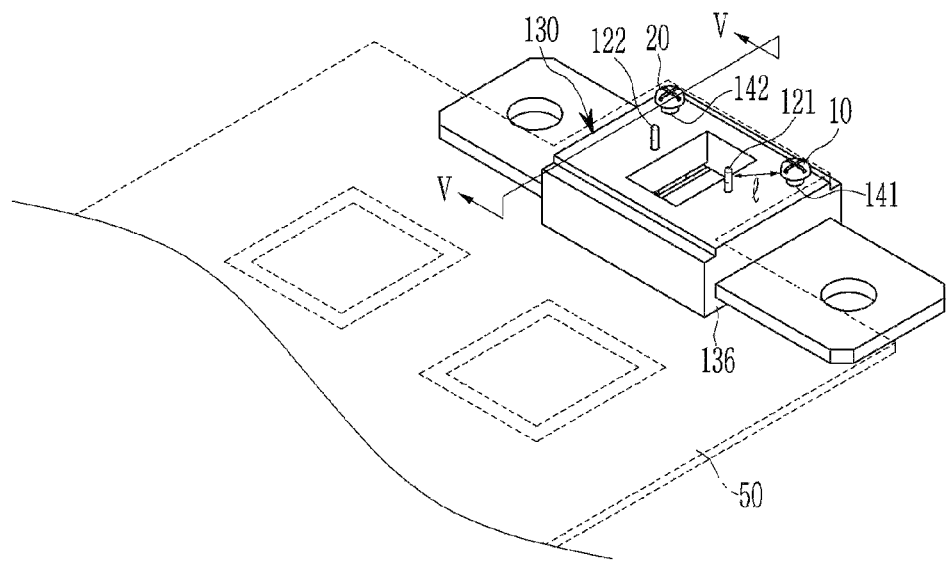
【Figure 5】
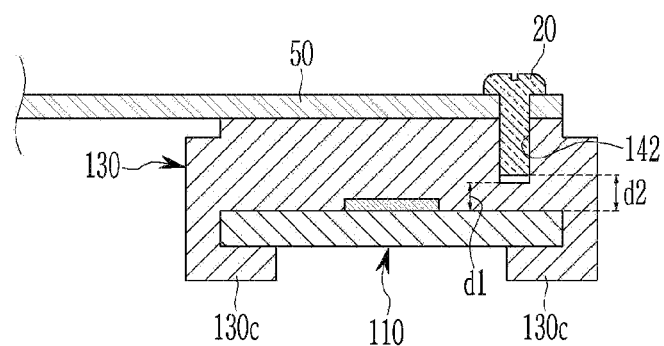
【Figure 6】
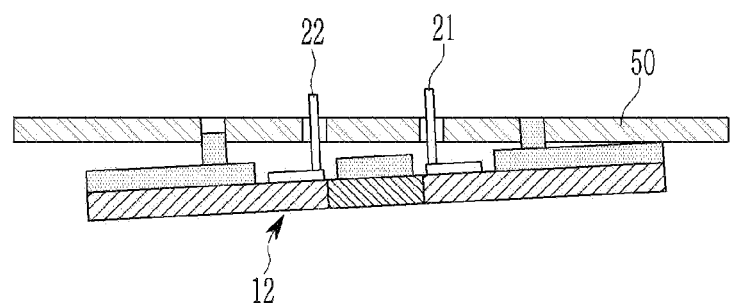

SHUNT RESISTOR MODULE HAVING SCREW COUPLING STRUCTURE

CROSS-REFERENCE TO RELATED APPLICATIONS

The present application is a national phase entry under 35 U.S.C. § 371 of International Application No. PCT/KR2019/017393 filed Dec. 10, 2019, published in Korean, which claims priority from Korean Patent Application No. 10-2018-0164125 filed Dec. 18, 2018, all of which are incorporated herein by reference.

TECHNICAL FIELD

The present invention relates to a shunt resistor module, and more particularly, to a shunt resistor module used to measure a current by detecting a current generated depending on a voltage drop across a resistor.

BACKGROUND ART

A rechargeable battery has high applicability according to a product line and has electrical characteristics such as high energy density, and thus it is widely used in electric vehicles or hybrid vehicles driven by electric driving sources, power storage devices, and the like, as well as portable devices. Such a rechargeable battery is attracting attention as a new energy source for eco-friendliness and energy efficiency enhancement thanks to not only a primary advantage of significantly reducing use of fossil fuels but also by-products that are not generated from the use of energy at all.

A power supply system of a battery pack using a rechargeable battery is generally equipped with a current sensor for measuring a current. The current sensor monitors a state of the battery pack by measuring the current flowing in a charging and discharging path of the battery pack, and detects an overcurrent flowing in the battery pack. In addition, the current measured through the current sensor may be used as information for calculating a state of charge (SOC), or may be used as a basis for determining whether a charging and discharging process is normally performed.

However, when the current sensor is not normally operated due to a failure or the like, it is impossible to properly sense a current flowing through the battery pack. As a result, even when an abnormal situation such as an overcurrent flow occurs, it may not be properly blocked, which may cause serious problems such as a failure or an explosion of the battery pack.

A shunt resistor is widely used to measure a current of a battery pack. A conventional shunt resistor has a terminal portion at opposite ends of a resistor portion, and lead pins protruding from these terminal portions may be physically and electrically connected to a printed circuit board through soldering. However, the lead pins may not only be broken in a process of assembling a bus bar in a state where the shunt resistor is poorly mounted, but may also be broken due to vibration or shock while being mounted on an electric vehicle or the like to be driven.

When the lead pins of the shunt resistor are broken, the current flowing through the battery pack is not properly sensed, and thus, even in an abnormal situation such as an overcurrent flow, it cannot be blocked and a malfunction or explosion of the entire battery pack may occur.

SUMMARY

Technical Problem

The present invention has been made in an effort to provide a shunt resistor module configured to enable screw fastening on a printed circuit board by coupling an injection material having a screw fastening hole to a shunt resistor.

However, the problems to be solved by the exemplary embodiments of the present invention are not limited to the above-described problems, and can be variously extended within the scope of the technical spirit included in the present invention.

Technical Solution

An exemplary embodiment of the present invention provides a shunt resistor module coupled to a printed circuit board, including: a resistor portion configured to have predetermined resistance; at least two terminal portions extending laterally from opposite ends of the resistor portion, each terminal portion having a respective first surface; lead pins fixed to and protruding from the respective first surfaces of the terminal portions, wherein the lead pins are configured to be electrically connected to the printed circuit board; and an exterior member adapted to at least partially cover the first surfaces of the terminal portions, wherein the exterior member includes: respective pin holes configured to receive the lead pins, wherein the lead pins are configured to protrude through the respective pin holes; and respective screw holes configured to be screwed to the printed circuit board.

The screw holes may be positioned in a first surface of the exterior member configured to cover the respective first surfaces of the terminal portions.

At least two screw holes may be symmetrically disposed at opposite sides of the exterior member with respect to the resistor portion.

The screw holes and the lead pins may be spaced apart from each other by a creepage amount or more.

A depth of the screw holes in the exterior member may be smaller than a height from the first surface of the exterior member to the respective first surfaces of the terminal portions.

The screw holes may be positioned laterally farther than the pin holes from the resistor portion.

The screw holes may be outwardly positioned farther than the pin holes with respect to the printed circuit board.

The exterior member may be made of a resin injection material.

Each of the terminal portions may be a plate-shaped terminal portion having fastening holes positioned therein, and the exterior member may be adapted to cover peripheries of the lead pins between the fastening holes.

The lead pins may protrude from first surfaces of the respective terminal portions, and the pin holes may be independent of each other and are configured to separately receive each of the lead pins.

A voltage drop across the resistor portion may be indicative of a current generated along an electrical path from a battery pack,

Advantageous Effects

According to an exemplary embodiment, a shunt resistor is screwed to a printed circuit board by using a shunt resistor module in which an injection material having a screw fastening hole is coupled to the shunt resistor, thereby preventing the lead pin from being broken even in the case of vibration of a defective lead pin or a device including a battery pack.

In the shunt resistor module according to the exemplary embodiment, vibration shock may be absorbed from an exterior member attached to a shunt resistor, and a stress concentrated on lead pins may be distributed to a screw member, thereby significantly reducing the stress on the lead pins.

BRIEF DESCRIPTION OF THE DRAWINGS

FIG. 1 illustrates an exploded perspective view of a shunt resistor module according to an exemplary embodiment of the present invention.

FIG. 2 illustrates a perspective view of a shunt resistor module according to an exemplary embodiment of the present invention.

FIG. 3 illustrates a bottom perspective view showing a shunt resistor module illustrated in FIG. 1.

FIG. 4 illustrates a perspective view showing a state in which a shunt resistor module is connected to a printed circuit board according to an example of the present invention.

FIG. 5 illustrates a cross-sectional view taken along a line V-V of FIG. 4.

FIG. 6 is a cross-sectional view showing a state in which a shunt resistor is connected to a printed circuit board according to a comparative example of the present invention.

DETAILED DESCRIPTION

The present invention will be described more fully hereinafter with reference to the accompanying drawings, in which exemplary embodiments of the invention are shown. As those skilled in the art wherein realize, the described embodiments may be modified in various different ways, all without departing from the spirit or scope of the present invention.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

FIG. 1 illustrates an exploded perspective view of a shunt resistor module 100 according to an exemplary embodiment of the present invention, FIG. 2 illustrates a perspective view of the shunt resistor module 100 according to an exemplary embodiment of the present invention, and FIG. 3 illustrates a bottom perspective view showing the shunt resistor module 100 illustrated in FIG. 1.

The shunt resistor module 100 according to the present embodiment includes an exterior member 130 for covering a shunt resistor 110, and may be fastened to a printed circuit board (PCB) 50 (see FIG. 4) to be used for measurement.

Referring to FIG. 1, the shunt resistor 110 includes a resistor portion 120 having a predetermined resistance value, and at least two terminal portions 111 and 112 extending from opposite ends of the resistor portion 120. Lead pins 121 and 122 are fixed to first surfaces of the terminal portions 111 and 112, and may be protruded to be electrically connected to the printed circuit board 50. The terminal portions 111 and 112 may formed to have a plate shape, to respectively extend to opposite sides with the resistor portion 120 at a center thereof, and fastening holes 113 and 114 may be respectively formed in the terminal portions 111 and 112.

The exterior member 130 may be formed to at least partially cover first surfaces of the terminal portions 111 and 112, and as shown in FIG. 2, pin holes 131 and 132 opened to expose the lead pins 121 and 122 and screw holes 141 and 142 for being screwed to the printed circuit board 50 may be formed. The lead pins 121 and 122 protruding from first surfaces of the respective terminal portions 111 and 112 may be inserted into corresponding pin holes 131 and 132 to be fixed and protected, and in this case, the pin holes 131 and 132 may be independent of each other to be formed separately for each of the lead pins 121 and 122.

The exterior member 130 may include upper surface portions 130a covering first surfaces of the terminal portions 111 and 112 and having the pin holes 131 and 132 and the screw holes 141 and 142, side surface portions 130b extending downwardly to surround side surfaces of the terminal portions 111 and 112, and lower surface portions 130c extending from the side surface portions 130b to second surfaces of the terminal portions 111 and 112 and covering them. The upper surface portions 130a of the exterior member 130 may be formed to cover a periphery of the lead pins 121 and 122 between the fastening holes 113 and 114 of the terminal portions 111 and 112. Referring to FIG. 3, the lower surface portions 130c may partially cover opposite edges of the terminal portions 111 and 112, and may be connected to each other by bridge portions 138 and 139. For example, two bridge portions 138 and 139 may be formed. As a result, the exterior member 130 may be formed to closely wrap a central portion thereof including the resistor portion 120 of the shunt resistor 110 from upper, lower, and side surfaces thereof, and the upper surface portions 130a, the side surface portions 130b, the lower surface portions 130c, and the bridge portions 138 and 139 may be integrally formed. The exterior member 130 having a structure as described above may be made of a resin injection material, and the exterior member 130 and the shunt resistor 110 that are coupled in this way may be manufactured by an insert molding process to become a shunt resistor module.

As described above, the screw holes 141 and 142 may be formed in first surfaces, e.g., the upper surface portions 130a, of the exterior member 130, which covers first surfaces on which the lead pins 121 and 122 protrude from the terminal portions 111 and 112, and the screw holes 141 and 142 are formed with screw threads therein, so that screw members 10 and 20 (see FIG. 4) such as screws or bolts may be fastened therewith. At least two screw holes 141 and 142 may be symmetrically disposed at opposite sides of the exterior member 130 with respect to the resistor portion 120. Therefore, when fastened to the printed circuit board 50 through the screw members 10 and 20, they may be symmetrically fixed around the resistor portion 120 to stably maintain a fixed state.

When viewed in a plane direction that is parallel to first surfaces of the terminal portions 111 and 112, the screw holes 141 and 142 may be positioned farther than the pin holes 131 and 132 from the resistor portion 120, and the screw holes 141 and 142 may be outwardly positioned farther than the pin holes 131 and 132 with respect to the printed circuit board 50. Accordingly, the lead pins 121 and 122 inserted into and fixed in the pin holes 131 and 132 may be stably fixed from the outside, and even when external vibration or the like occurs, it is possible to prevent fixed portions of the lead pins 121 and 122 from being affected. In this case, a distance between the pin holes 131 and 132 and the screw holes 141 and 142 may be adjusted in proportion to a magnitude of a current and a voltage applied to the shunt resistor 110. Accordingly, a distance between the lead pins 121 and 122 and the screw members 10 and 20 may be controlled.

On the other hand, the shunt resistance module according to another exemplary embodiment may be formed in the exterior member, so that one pin hole may be formed to expose the lead pins. Thus, the pin hole may be formed as a single integrated hole rather than being independently and individually formed for each of the lead pins. In addition, the exterior member according to another exemplary embodiment may be formed to have one or three or more bridge portions on a bottom surface thereof, or may be formed to cover lower surfaces of the terminal portions as much as the upper surface thereof without forming the bridge portion.

In addition, the shunt resistance module according to another exemplary embodiment may form a screw hole near each corner of the upper surface. That is, four screw holes may be formed.

FIG. 4 illustrates a perspective view showing a state in which the shunt resistor module 100 is connected to the printed circuit board 50 according to an example of the present invention, and FIG. 5 illustrates a cross-sectional view taken along a line V-V of FIG. 4.

As illustrated in FIG. 4, the printed circuit board 50 has a protrusion corresponding to the exterior member 130 of the shunt resistor module 100, and the upper surface portions 130a of the exterior member 130 are superimposed on the protrusion to come into contact therewith. Soldering holes are positioned in the printed circuit board 50 to correspond to the lead pins 121 and 122 of the shunt resistor module 100 to be electrically connected thereto through soldering. Similarly, openings may be formed to correspond to the screw holes 141 and 142 of the exterior member 130 in the printed circuit board 50, and the screw members 10 and 20 may be screwed into the screw holes 141 and 142 of the exterior member 130 through the openings of the printed circuit board 50. For example, a fastening member having a thread on the outside, such as a bolt or a screw, may be applied as the screw members 10 and 20.

The screw holes 141 and 142 to which the screw members 10 and 20 are fastened and the lead pins 121 and 122 of the shunt resistor module 100 need to be spaced from each other by greater than a creepage amount depending on a voltage magnitude of a system, i.e., a minimum insulation distance. That is, a distance "1" measured along a surface of the printed circuit board 50 between the screw members 10 and 20 and the lead pins 121 and 122 may be set in proportion to magnitudes of a current and a voltage across the shunt resistor, and may be designed to a certain level or more in consideration of the creepage.

Meanwhile, referring to FIG. 5, a depth of the screw holes 141 and 142 formed in the exterior member 130 may be formed to be smaller than a thickness from a surface of the exterior member 130 to the first surface of the shunt resistor 110. Furthermore, a thickness of the exterior member 130 may be set in consideration of the required creepage between the screw members 10 and 20 and the shunt resistor 110 and may be determined in consideration of a distance d1 between the screw hole 142 and the shunt resistor 110 as illustrated in FIG. 5, and the length of the screw member 20 and the thickness of the exterior member 130 may be determined in consideration of a distance d2 between the screw member 20 and the shunt resistor 110. Even when the screw members 10 and 20 are added by forming it in consideration of the creepage in this way, a current flow is not affected. In addition, it is possible to prevent dangers such as short circuits that may occur due to a short creepage.

With regard to setting of the creepage, a distance may be calculated in compliance with the specifications depending on requirements of the device or field to which the shunt resistor module according to the present exemplary embodiment is applied. For example, the creepage may be set in consideration of an international electrotechnical commission (IEC) standard, an Underwriters Laboratories Inc. (UL) standard, a Verde Deutscher Elektrotrchniker (VDE) standard, or a Japanese standard.

FIG. 6 is a cross-sectional view showing a state in which a shunt resistor 12 is connected to the printed circuit board 50 according to a comparative example of the present invention.

Referring to FIG. 6, unlike the shunt resistor module 100 according to the example, the shunt resistor 12 of the comparative example may be adhered to the printed circuit board 50 without including a separate external member around lead pins 21 and 22. That is, the shunt resistor 12 of the comparative example may have terminal portions at opposite ends of the resistor portion, and the lead pins 21 and 22 protruding from these terminal portions may be physically and electrically connected to the printed circuit board 50 through soldering. However, the lead pins 21 and 22 may not only be broken in a process of assembling a bus bar in a state where the shunt resistor 12 is poorly mounted, but may also be broken due to vibration or shock while being mounted on an electric vehicle or the like to be driven.

That is, the lead pins 21 and 22 were performing not only the electrical connection of the printed circuit board 50 but also the physical fixation function in the shunt resistor 12 of the comparative example, but according to the example, vibration shock is absorbed from the exterior member 130 attached to the shunt resistor 110, and a stress concentrated on the lead pins 121 and 122 is distributed to the screw members 10 and 20 in the shunt resistor module 100. Since the shock absorber is absorbed once from the exterior member 130 made of an injection material and the shunt resistor 110 is firmly fixed to the printed circuit board 50 by using the screw members 10 and 20, the stress of the lead pins 121 and 122 of the shunt resistor 110 may be significantly reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope greater than or equal to appended claims.

The invention claimed is:

1. A shunt resistor module coupled to a printed circuit board, comprising:
   a resistor portion having a predetermined resistance;
   at least two terminal portions extending laterally from opposite ends of the resistor portion, each terminal portion having a respective first surface;
   lead pins fixed to and protruding from the respective first surfaces of the terminal portions, wherein the lead pins are configured to be electrically connected to the printed circuit board; and
   an exterior member adapted to at least partially cover the first surfaces of the terminal portions, wherein the exterior member includes:

respective pin holes configured to receive the lead pins, wherein the lead pins are configured to protrude through the respective pin holes; and a plurality of screw holes configured to be aligned with corresponding screw holes in the printed circuit board, wherein the plurality of screw holes are configured to receive respective screws to be screwed to the printed circuit board.

2. The shunt resistor module of claim 1, wherein the screw holes are positioned in a first surface of the exterior member configured to cover the respective first surfaces of the terminal portions.

3. The shunt resistor module of claim 1, wherein at least two screw holes are symmetrically disposed at opposite sides of the exterior member with respect to the resistor portion.

4. The shunt resistor module of claim 1, wherein the screw holes and the lead pins are spaced apart from each other by at least a creepage amount sufficient to maintain insulation between the respective screws to be screwed to the printed circuit board and the lead pins.

5. The shunt resistor module of claim 2, wherein a depth of the screw holes in the exterior member is smaller than a height from the first surface of the exterior member to the respective first surfaces of the terminal portions.

6. The shunt resistor module of claim 1, wherein the screw holes are positioned laterally farther than the pin holes from the resistor portion.

7. The shunt resistor module of claim 1, wherein the shunt resistor module is coupled to an edge of the printed circuit board, and wherein the screw holes are positioned closer to the edge of the printed circuit board than the pin holes are positioned.

8. The shunt resistor module of claim 1, wherein the exterior member is made of a resin injection material.

9. The shunt resistor module of claim 1, wherein each of the terminal portions is a plate-shaped terminal portion having fastening holes positioned therein, and the exterior member is adapted to cover peripheries of the lead pins between the fastening holes.

10. The shunt resistor module of claim 1, wherein the lead pins protrude from the first surfaces of the respective terminal portions, and the pin holes are independent of each other and are configured to separately receive each of the lead pins.

11. The shunt resistor module of claim 1, wherein a voltage drop across the resistor portion is indicative of a current generated along an electrical path from a battery pack.

12. The shunt resistor module of claim 1, wherein the exterior member includes an upper surface covering the respective first surfaces of the terminal portions, a sidewall extending downward to cover respective side surfaces of the terminal portions, and a lower surface partially covering respective second surfaces of the terminal portions opposite the respective first surfaces.

* * * * *